United States Patent
Park

(10) Patent No.: US 7,342,837 B2
(45) Date of Patent: Mar. 11, 2008

(54) SEMICONDUCTOR MEMORY DEVICE

(75) Inventor: Chul-Woo Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/435,636

(22) Filed: May 17, 2006

(65) Prior Publication Data

US 2007/0008681 A1    Jan. 11, 2007

(30) Foreign Application Priority Data

Jul. 7, 2005    (KR) .............. 10-2005-0061430

(51) Int. Cl.
*G11C 7/00*    (2006.01)

(52) U.S. Cl. ............ 365/189.09; 365/226; 365/225.7

(58) Field of Classification Search .......... 365/189.09, 365/225.7, 226

See application file for complete search history.

(56) References Cited

U.S. PATENT DOCUMENTS

| 6,538,337 B2 | 3/2003 | Song | 257/786 |
| 2004/0012991 A1* | 1/2004 | Kozaru | 365/52 |
| 2004/0109368 A1 | 6/2004 | Kuroda | 365/200 |
| 2005/0162182 A1* | 7/2005 | Ong | 365/201 |

FOREIGN PATENT DOCUMENTS

| JP | 05-029372 | 2/1993 |
| JP | 2004-186435 | 7/2004 |
| KR | 1020010055860 A | 7/2001 |
| KR | 1020020014643 | 2/2002 |
| KR | 1020030046223 A | 12/2003 |

* cited by examiner

*Primary Examiner*—Thong Q. Le
(74) *Attorney, Agent, or Firm*—Mills & Onello LLP

(57) ABSTRACT

A semiconductor memory device includes a semiconductor chip including a first voltage generating circuit that generates a first voltage in response to a first operation control signal, a second voltage generating circuit that generates a second voltage in response to a second operation control signal, a first operation control circuit that generates the first operation control signal, a second operation control circuit that generates the second operation control signal, a first bonding pad connected to an output of the first voltage generating circuit, and a second bonding pad connected to an output of the second voltage generating circuit. A packaging substrate includes a first substrate pad connected to the first bonding pad and a second substrate pad connected to the second bonding pad. The first and second substrate pads are connected to each other through the packaging substrate.

24 Claims, 4 Drawing Sheets

SEMICONDUCTOR MEMORY DEVICE

CROSS-REFERENCE TO RELATED APPLICATION

This application claims the benefit of Korean Patent Application No. 2005-61430, filed Jul. 07, 2005, the disclosure of which is hereby incorporated herein by reference in its entirety.

BACKGROUND OF THE INVENTION

1. Field of the Invention

The present invention relates to a semiconductor memory device and, more particularly, to a semiconductor memory device which can control respective operations of a plurality of internal voltage generating circuits when the semiconductor device is in a packaged state.

2. Description of the Related Art

Generally, a semiconductor memory device includes a plurality of internal voltage generating circuits which generate internal voltages which are necessary for operation of the semiconductor memory device by using an external power voltage supplied from an external location.

In the case of a dynamic random access memory (DRAM), the semiconductor memory device includes a VPP voltage generating circuit for generating a boosted voltage VPP (e.g., voltage of greater than 2 volts and less than 3.5 volts), a VINT voltage generating circuit for generating an internal operating voltage VINT (e.g., voltage of greater than 1.5 volts and less than external power voltage), and a VBB voltage generating circuit for generating a back bias voltage VBB (e.g., voltage of greater than −0.7 volts and less than ground voltage VSS).

With the continuing trend in semiconductor memory devices in the pursuit of low power consumption, high integration and high performance, the internal voltage generating circuits arranged in semiconductor memory devices continue to increase in kind and number.

For example, conventional semiconductor memory devices have employed a VBB voltage generated from the VBB voltage generating circuit as a back bias voltage of a semiconductor substrate and a negative voltage of a word line driver; however, recent semiconductor memory devices include first and second VBB voltage generating circuits and employ a VBB1 voltage (e.g., greater than −0.7 volts and less than ground voltage VSS) generated from the first VBB voltage generating circuit as a back bias voltage of the semiconductor substrate and a VBB2 voltage (e.g., greater than −0.4 volts and less than ground voltage VSS) generated from the second VBB voltage generating circuit as the negative voltage of the word line driver.

As the kind and number of required internal voltages are increased, certain internal voltage generating circuits in the semiconductor memory device become to generate similar, or overlapping, voltage levels.

Therefore the semiconductor memory device may select one of internal voltage generating circuits that generates voltage levels required to operate in a final, manufactured state of the semiconductor memory device, considering processing parameters and designing parameters thereof.

However, the conventional semiconductor memory device does not have a means for selecting the suitable internal voltage generating circuit among certain internal voltage generating circuits and to replace certain internal voltage generating circuits as the selected internal voltage generating circuit in a final, manufactured state of the semiconductor memory device.

As a result, when one of certain internal voltage generating circuits is needed in a state where the semiconductor chip is completely manufactured, the product manufacturer is required to reflect this in the product design and to re-manufacture the semiconductor chip. Accordingly, there is a problem in that cost and time to manufacture the semiconductor memory device are increased as a result.

SUMMARY OF THE INVENTION

It is an object of the present invention to provide a semiconductor memory device in which a plurality of internal voltage generating circuits are connected to each other via a packaging substrate, and one among a plurality of internal voltage generating circuits is selected for operation in the process of packaging a semiconductor chip.

It is another object of the present invention to provide a semiconductor memory device in which a plurality of internal voltage generating circuits which are connected to each other via a packaging substrate can generate internal voltages having the same level, thereby increasing capability to supply the internal voltage and improving the resulting stability of the internal voltage.

In one aspect, the present invention is directed to a semiconductor memory device, comprising: a semiconductor chip including a first voltage generating circuit that generates a first voltage in response to a first operation control signal, a second voltage generating circuit that generates a second voltage in response to a second operation control signal, a first operation control circuit that generates the first operation control signal, a second operation control circuit that generates the second operation control signal, a first bonding pad connected to an output of the first voltage generating circuit, and a second bonding pad connected to an output of the second voltage generating circuit; and a packaging substrate including a first substrate pad connected to the first bonding pad and a second substrate pad connected to the second bonding pad, wherein the first and second substrate pads are connected to each other through the packaging substrate.

In one embodiment, each of the first and second operation control circuits is a fuse circuit which generates the first and second operation control signals in response to a programming status of a fuse.

In another embodiment, each of the first and second operation control circuits includes: a first fuse connected to a power voltage; a first PMOS transistor connected between the fuse and a node and being turned on and off in response to a control signal; a first NMOS transistor connected between the node and a ground voltage and being turned on and off in response to the control signal; a second NMOS transistor connected between the node and the ground voltage and being turned on and off in response to a feed back signal; a first inverter for inverting a signal applied to the node to generate the feed back signal; and a second inverter for inverting the feed back signal to generate an output signal.

In another embodiment, the control signal is generated when a power up is detected, i.e., when applied power is initiated.

In another embodiment, the packaging substrate connects the first and second substrate pads using at least one of a wire bonding and a beam lead.

In another aspect, the present invention is directed to a semiconductor memory device, comprising: a semiconductor chip including a first voltage generating circuit that selects whether to generate a first voltage in response to a first operation control signal and that varies a voltage level of the first voltage in response to a first voltage control signal, a second voltage generating circuit that selects whether to generate a second voltage in response to a second operation control signal, a first operation control circuit that generates the first operation control signal, a second operation control circuit that generates the second operation control signal, a first voltage control circuit that generates the first voltage control signal, a first bonding pad connected to the first voltage generating circuit, and a second bonding pad connected to the second voltage generating circuit; and a packaging substrate including a first substrate pad connected to the first bonding pad and a second substrate pad connected to the second bonding pad, wherein the first and second substrate pads are connected to each other through the packaging substrate.

In one embodiment, the first voltage generating circuit generates the first voltage which has the same voltage level as the second voltage in response to the first voltage control signal.

In another embodiment, the device further comprises a second voltage control circuit that generates a second voltage control signal, wherein the second voltage generating circuit further varies a voltage level of the second voltage in response to the second voltage control signal.

In another embodiment, the second voltage generating circuit generates the second voltage which has the same voltage level as the first voltage in response to the second voltage control signal.

In another embodiment, the first and second voltage control circuits generate a third voltage in response to the first and second voltage control signals.

In another embodiment, each of the first and second voltage control circuits is a mode register set which generates a signal in response to externally applied coding signals.

In another embodiment, each of the first and second voltage control circuits includes a plurality of fuse circuits which generate first and second voltage control signals in response to programming statuses of fuses.

In another embodiment, each of the plurality of fuse circuits includes: a first fuse connected to a power voltage; a first PMOS transistor connected between the fuse and a node and being turned on and off in response to a control signal; a first NMOS transistor connected between the node and a ground voltage and being turned on and off in response to the control signal; a second NMOS transistor connected between the node and the ground voltage and being turned on and off in response to a feed back signal; a first inverter for inverting a signal applied to the node to generate the feed back signal; and a second inverter for inverting the feed back signal to generate an output signal.

In another embodiment, the control signal is generated when a power up is detected, i.e., when applied power is initiated.

In another embodiment, each of the first and second operation control circuits is a fuse circuit which generates the first and second operation control signals in response to a programming status of a fuse.

In another embodiment, each of the first and second operation control circuits includes: a second fuse connected to a power voltage; a second PMOS transistor connected between the fuse and a node and being turned on and off in response to a control signal; a third NMOS transistor connected between the node and a ground voltage and being turned on and off in response to the control signal; a fourth NMOS transistor connected between the node and the ground voltage and being turned on and off in response to a feed back signal; a third inverter for inverting a signal applied to the node to generate the feed back signal; and a fourth inverter for inverting the feed back signal to generate an output signal.

In another embodiment, the control signal is generated when a power up is detected.

In another embodiment, the packaging substrate connects the first and second substrate pads using at least one of a wire bonding and a beam lead.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EMBODIMENTS OF THE INVENTION

Figure 1:
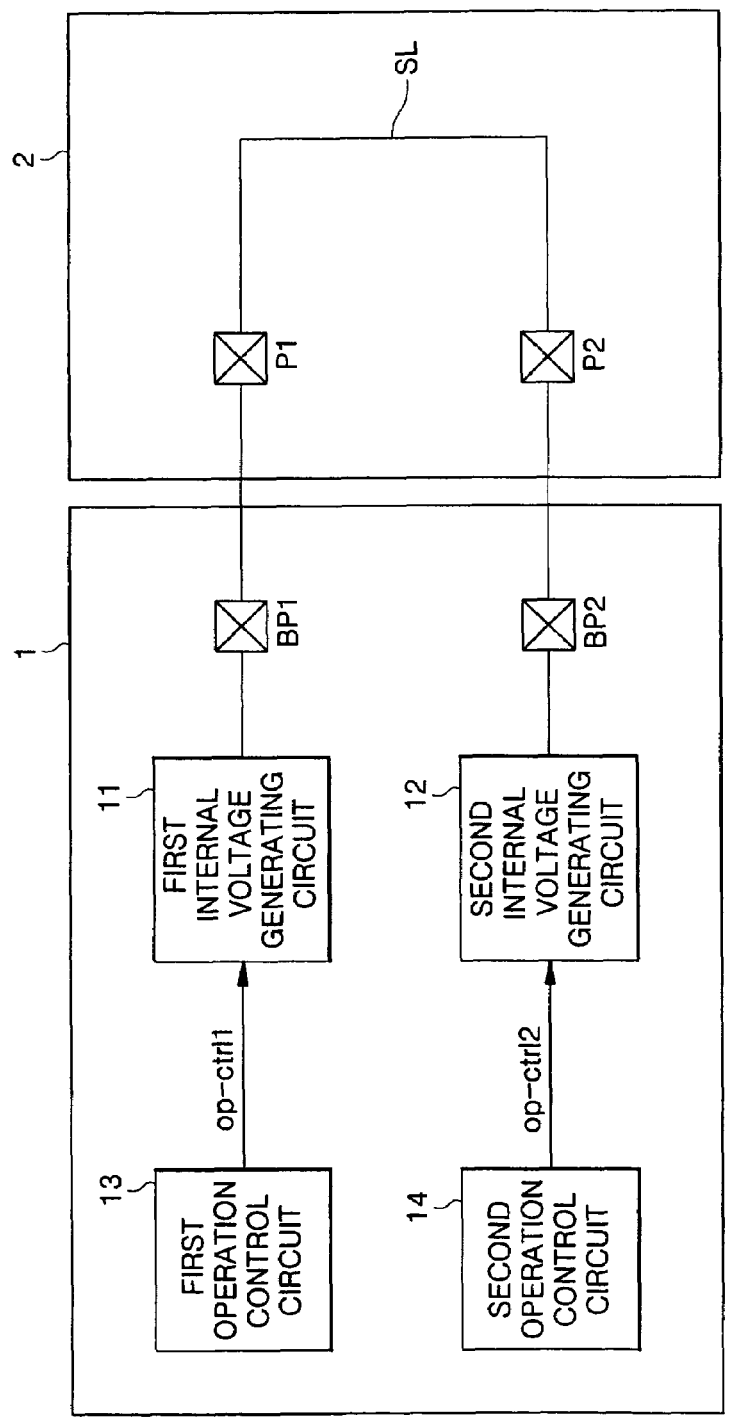
FIG. 1 is a block diagram illustrating a semiconductor memory device according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete. In the drawings, the thickness of layers and regions are exaggerated for clarity. Like numbers refer to like elements throughout the specification.

FIG. 1 is a block diagram illustrating a semiconductor memory device according to an embodiment of the present invention.

Referring to FIG. 1, the semiconductor memory device includes a semiconductor chip 1 and a packaging substrate 2. The semiconductor chip 1 includes a first internal voltage generating circuit 11, a second internal voltage generating circuit 12, a first operation control circuit 13, a second operation control circuit 14, and bonding pads BP1 and BP2. The packaging substrate 2 includes substrate pads P1 and P2 and substrate wire lines SL. In one embodiment, the semiconductor memory device is packaged using a ball grid array packaging method.

The first internal voltage generating circuit 11 operates in response to a first operation control signal op_ctrl1, and generates a first internal voltage Vin1 from an external power voltage VCC when its operation is enabled.

The second internal voltage generating circuit 12 operates in response to a second operation control signal op_ctrl2, and generates a second internal voltage Vin2 from an external power voltage VCC when its operation is enabled.

The first and second internal voltage generating circuits 11 and 12 can be applied to various circuits which generate the internal voltages having similar voltage levels to replace the second and first internal voltage generating circuits 12 and 11. For example, the first and second internal voltage generating circuits 11 and 12 can comprise a first VBB voltage generating circuit to generate the back bias voltage of the semiconductor substrate and a second VBB voltage generating circuit to generate the negative voltage of the word line driver.

The first operation control circuit 13 includes a fuse that can be programmed to generate the first operation control signal op_ctrl1 for controlling operation of the first internal voltage generating circuit 11. For example, the first operation control circuit 13 generates the operation control signal op_ctrl1 for disabling operation of the first internal voltage generating circuit 11 when the fuse is cut, and generates the operation control signal op_ctrl1 for enabling operation of the first internal voltage generating circuit 11 when the fuse is connected.

The second operation control circuit 14 includes a fuse like the first operation control circuit 13 and programs the fuse to generate the second operation control signal op_ctrl2 for controlling operation of the second internal voltage generating circuit 12.

The first bonding pad BP1 is directly connected to the first internal voltage generating circuit 11 and is connected to the output of the second internal voltage generating circuit 12 through a first substrate pad P1, a substrate wire line SL, and a second substrate pad P2 of the packaging substrate 2 and a second bonding pad BP2.

The second bonding pad BP2 is directly connected to output of the second internal voltage generating circuit 12 and is connected to the first internal voltage generating circuit 11 through the second substrate pad P2, the substrate wire line SL, the first substrate pad P1 of the packaging substrate 2 and the first bonding pad BP1.

The first substrate pad P1 is directly connected to the first bonding pad BP1 by a discrete connection means (e.g., wire bonding or beam lead) which is not shown, and the second substrate pad P2 is directly connected to the second bonding pad BP2 by a discrete connection means (e.g., wire bonding or beam lead).

The substrate wire line SL is implemented by a wire bonding or beam lead in the packaging substrate 2 to connect the first and second substrate pads P1 and P2.

Operation of the semiconductor memory device will now be explained with reference to FIG. 1.

First, when the semiconductor chip 1 requires the first internal voltage Vin1 as the internal voltage for operation, the semiconductor memory device operates as follows.

The fuse of the first operation control circuit 13 is connected so as to generate the first operation control signal op_ctrl1 for enabling operation of the first internal voltage generating circuit 11, and the fuse of the second operation control circuit 14 is cut so as to generate the second operation control signal op_ctrl2 for disabling operation of the second internal voltage generating circuit 12.

As a result, the first internal voltage generating circuit 11 is enabled and the second internal voltage generating circuit 12 is disabled, so that the first internal voltage Vin1 is applied to the first bonding pad BP1 and the second bonding pad BP2.

That is, the semiconductor memory device controls the first and second operation control circuits 13 and 14 to enable only the first internal voltage generating circuit 11 to thereby replace the second internal voltage Vin2 as the first internal voltage Vin1.

On the other hand, when the semiconductor chip 1 requires the second internal voltage Vin2 as an internal voltage for operation, the semiconductor memory device operates as follows.

The fuse of the first operation control circuit 13 is cut so as to generate the first operation control signal op_ctrl1 for disabling operation of the first internal voltage generating circuit 11, and the fuse of the second operation control circuit 14 is connected so as to generate the second operation control signal op_ctrl2 for enabling operation of the second internal voltage generating circuit 12. As a result, the second internal voltage generating circuit 12 is enabled, and the first internal voltage generating circuit 11 is disabled, whereby the second internal voltage Vin2 is generated and applied to the second bonding pad BP2. The second internal voltage Vin2 applied to the second bonding pad BP2 is supplied to the first bonding pad BP1 through the second substrate pad P2, the substrate wire line SL and the first substrate pad P1 of the packaging substrate 2. That is, the semiconductor memory device controls the first and second operation control circuits 13 and 14 to enable only the second internal voltage generating circuit 12 to thereby replace the first internal voltage Vin1 as the second internal voltage.

Figure 2:
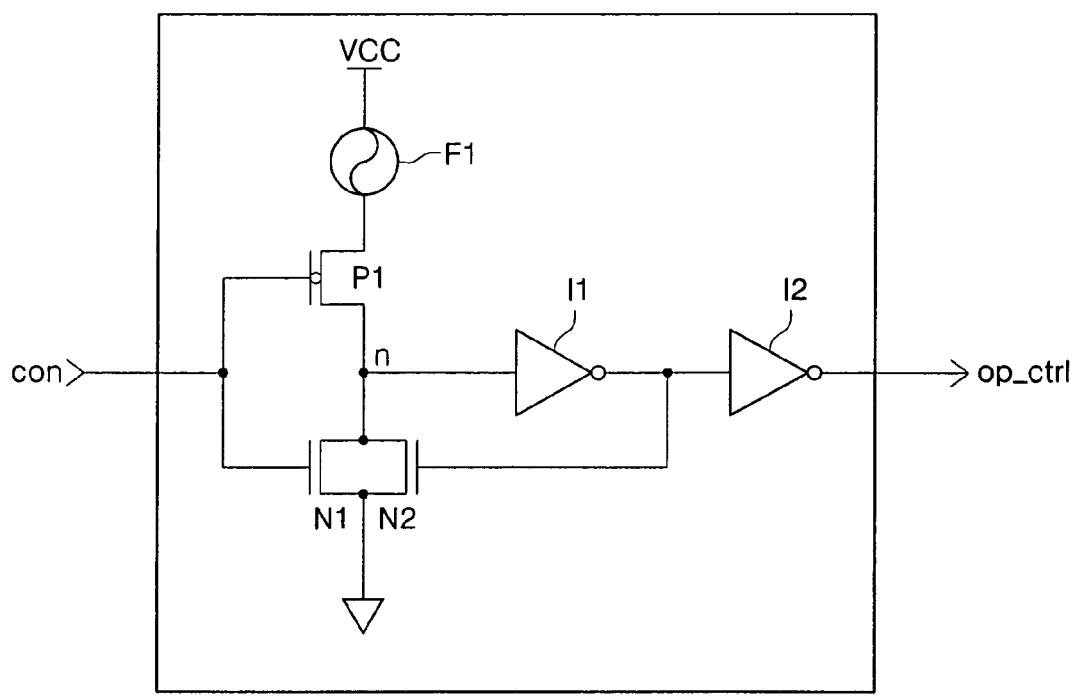
FIG. 2 is a circuit diagram illustrating an operation control circuit according to an embodiment of the present invention.

FIG. 2 is a circuit diagram illustrating the operation control circuit 13 or 14 according to an embodiment of the present invention.

Referring to FIG. 2, the operation control circuit includes a fuse F1 connected to an external power voltage VCC, a PMOS transistor P1 having a source connected to the fuse F1, a drain connected to a node n and a gate receiving a control signal con, an NMOS transistor N1 having a drain connected to the node n, a source connected to a ground voltage VSS and a gate receiving the control signal con, an NMOS transistor N2 having a drain connected to the node n, a source connected to the ground voltage VSS and a gate receiving an output signal of an inverter I1, and inverters I1 and I2 serially connected to the node n and generating the first operation control signal op_ctrl in response to the voltage of node n.

Operation of the operation control circuit of FIG. 2 will be explained below.

Here, the control signal con is generated when a power up is detected, and it has a low level at the initial stage, and transitions to a high level and transitions to a low level again when a power voltage is applied.

When the fuse F1 is cut, the operation control circuit of FIG. 2 operates as follows.

When the control signal con transitions to a high level from a low level, the PMOS transistor P1 is turned off, and the NMOS transistor N1 is turned on, so that the voltage at node n becomes a ground voltage level. The inverters I1 and I2 buffer a signal having a voltage level of the node n and generate the first operation control signal op_ctrl having a low level. The NMOS transistor N2 is turned on in response to a high signal from the inverter I1 and maintains the voltage level of the node n.

Then, when the control signal con transitions to a low level from a high level again, the PMOS transistor P1 is turned on, and the NMOS transistor N1 is turned off. However, since the fuse F1 is cut, the external power voltage VCC is not applied to the source of the PMOS transistor P1. So the node n maintains a ground voltage level, and the inverters I1 and I2 continuously generate a signal op_ctrl having a low level.

However when the fuse F1 is connected, the operation control circuit of FIG. 2 operates as follows.

When the fuse F1 is connected, the external power voltage VCC is applied to the source of the PMOS transistor P1.

Then, when the control signal con transitions to a high level from a low level, the PMOS transistor P1 is turned off, and the NMOS transistor N1 is turned on, so that the node n becomes a ground voltage level. The inverters I1 and I2 buffer a signal having a low level of the node n and generate the operation control signal op_ctrl having a low level, and the NMOS transistor N2 is turned on in response to a signal having a high level from the inverter I1 and which places the node n1 at a ground voltage level.

In this state, when the control signal con transitions to a low level from a high level again, the PMOS transistor P1 is turned on, and the NMOS transistor N1 is turned off, so that the external power voltage VCC is applied to the node n. The inverters I1 and I2 buffer a signal of the node n and generate the operation control signal op_ctrl having a high level, and the NMOS transistor N2 is turned off in response to a signal having a low level from the inverter I1.

As a result, the node n maintains the external voltage VCC level, and the inverters I1 and I2 continuously generate a signal having a high level.

The operation control circuit of FIG. 2 generates a signal the voltage level of which depends on whether the fuse is cut or not. That is, a signal generated when the fuse is cut is the operation control signal op_ctrl for disabling operation of the internal voltage generating circuit, and a signal generated when the fuse is connected is the operation control signal op_ctrl for enabling operation of the internal voltage generating circuit. It should be noted, however, that the operation control circuit can be readily configured to generate an operation control signal op_ctrl that enables operation of the corresponding internal voltage generating circuit when the fuse is cut and that disables operation of the corresponding internal voltage generating circuit when the fuse is connected.

Accordingly, the semiconductor memory device according to an embodiment of the present invention connects a plurality of internal voltage generating circuits through the packaging substrate and can select one that is required for operation among a plurality of internal voltage generating circuits by the first and second, or more, operation control circuits when packaging the semiconductor chip.

Figure 3:
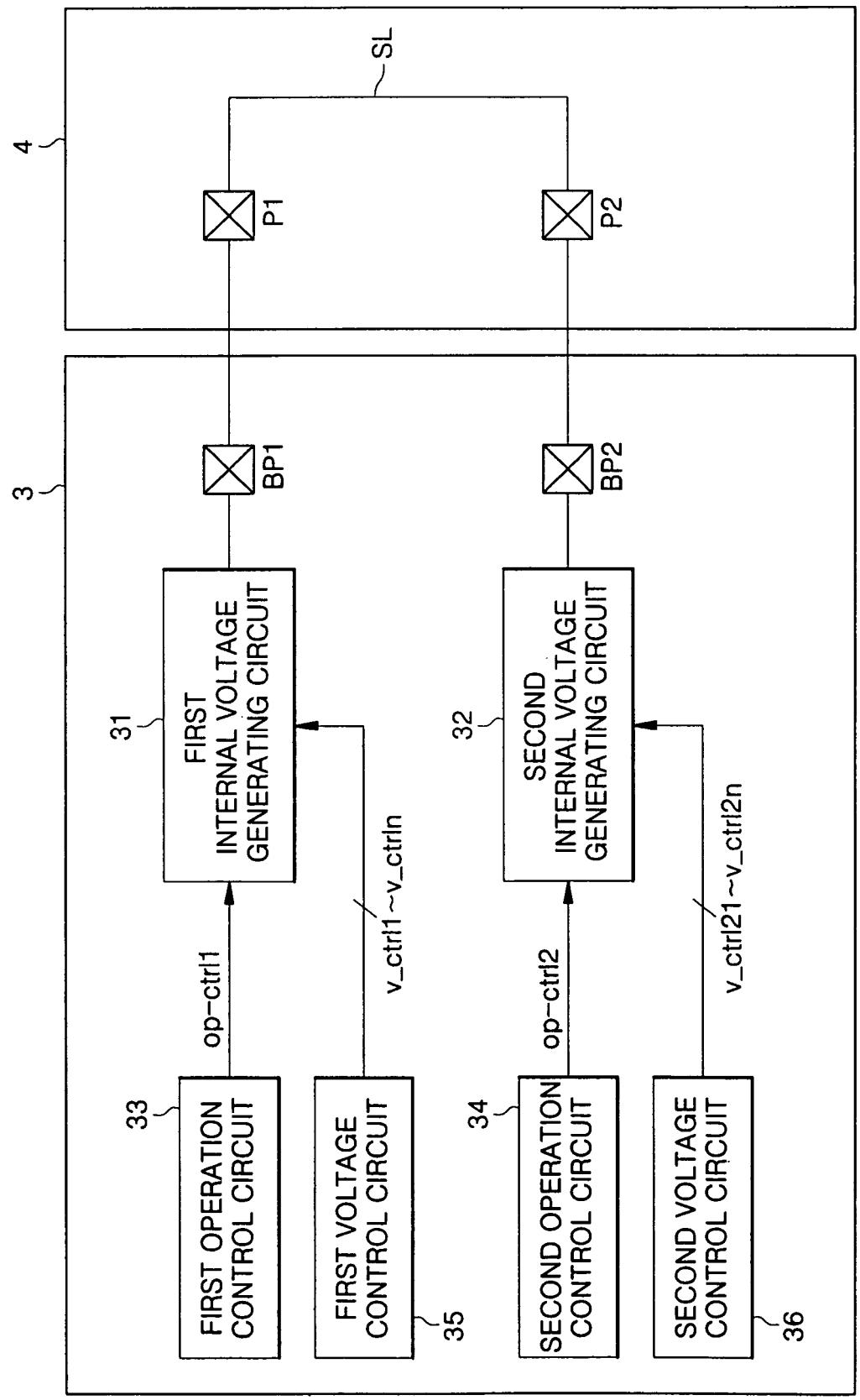
FIG. 3 is a block diagram illustrating a semiconductor memory device according to another embodiment of the present invention.

FIG. 3 is a block diagram illustrating a semiconductor memory device according to another embodiment of the present invention.

Referring to FIG. 3, the semiconductor memory device includes a semiconductor chip 3 and a packaging substrate 4. The semiconductor chip 3 includes a first internal voltage generating circuit 31, a second internal voltage generating circuit 32, a first operation control circuit 33, a second operation control circuit 34, a first voltage control circuit 35, a second voltage control circuit 36, and bonding pads BP1 and BP2. The packaging substrate 4 includes substrate pads P1 and P2 and substrate wire lines SL. In one embodiment, the semiconductor memory device is packaged using a ball grid array packaging method.

The first internal voltage generating circuit 31 operates in response to a first operation control signal op_ctrl1, and varies a voltage level of a first internal voltage Vin1 according to applied first voltage control signals v_ctrl11 to v_ctrl1n. For example, when enabled by the first operation control signal op_ctrl1, the first internal voltage generating circuit 31 varies a first reference voltage according to the first control signals v_ctrl11 to v_ctrl1n and varies a voltage level of the first internal voltage Vin1 according to the varied first reference voltage.

The second internal voltage generating circuit 32 operates in response to a second operation control signal op_ctrl2, and varies a voltage level of a second internal voltage Vin2 according to applied second voltage control signals v_ctrl21 to v_ctrl2n. For example, when enabled by the second operation control signal op_ctrl2, the second internal voltage generating circuit 32 varies a second reference voltage according to the second control signals v_ctrl21 to v_ctrl2n and varies a voltage level of the second internal voltage Vin2 according to the varied second reference voltage.

The first and second internal voltage generating circuits 31 and 32 can be applied to various circuits which generate the internal voltages having similar voltage levels to replace the second and first internal voltage generating circuits 32 and 31.

The first operation control circuit 33 of FIG. 3 includes a fuse like the first operation control circuit 13 of FIG. 1 and programs the fuse to generate the first operation control signal op_ctrl1 for controlling operation of the first internal voltage generating circuit 31.

The second operation control circuit 34 includes a fuse like the second operation control circuit 14 of FIG. 1 and programs the fuse to generate the second operation control signal op_ctrl2 for controlling operation of the second internal voltage generating circuit 32.

The first voltage control circuit 35 can be implemented by a mode register set or by a plurality of fuses and generates the first voltage control signals v_ctrl11 to v_ctrl1n for varying a voltage level of the first internal voltage Vin1. The first voltage control circuit 35 generates the first voltage control signals v_ctrl1n to v_ctrl1n in response to coding signals (e.g., command signals and address signals) transmitted from an external source when implemented by a mode register set, and generates the first voltage control signals v_ctrl1n to v_ctrl1n in response to status of a plurality of fuses, when implemented by a plurality of fuses.

The second voltage control circuit 36 can likewise be implemented by a mode register set or by a plurality of fuses in a manner similar to the first voltage control circuit 35 and generates the second voltage control signals v_ctrl21 to v_ctrl2n for varying a voltage level of the second internal voltage Vin2.

The first bonding pad BP1 is directly connected to an output of the first internal voltage generating circuit 31 and is connected to the second internal voltage generating circuit 32 through the second bonding pad BP2 and the first and second substrate pads P1 and P2 and the substrate wire line SL of the packaging substrate 4.

The second bonding pad BP2 is directly connected to an output of the second internal voltage generating circuit 32 and is connected to the first internal voltage generating circuit 31 through the first bonding pad BP1 and the first and second substrate pads P1 and P2 and the substrate wire line SL of the packaging substrate 4.

The first substrate pad P1 is directly connected to the first bonding pad BP1 by a discrete connection means (e.g., wire bonding or beam lead) which is not shown, and the second substrate pad P2 is directly connected to the second bonding pad BP2 by a discrete connection means (e.g., wire bonding or beam lead).

The substrate wire line SL is implemented by a wire bonding or beam lead in the packaging substrate 2 to connect the first and second substrate pads P1 and P2.

Operation of the semiconductor memory device will now be explained with reference to FIG. 3.

Here, it is assumed that the first internal voltage generating circuit 31 has an output voltage that ranges from a first voltage V1 to a second voltage V2, the second internal voltage generating circuit 32 has an output voltage that ranges from a third voltage V3 to a fourth voltage V4, and the amplitude of the voltage level is in the order of the third voltage V3, the first voltage V1, the fourth voltage V4, and the second voltage V2.

First, when the semiconductor chip 3 requires an internal voltage having a voltage level that ranges from the fourth voltage V4 to the second voltage V2, the semiconductor memory device operates as follows.

The first operation control circuit 33 generates the first operation control signal op_ctrl1 for enabling operation of the first internal voltage generating circuit 31, the second operation control circuit 34 generates the second operation control signal op_ctrl2 for disabling operation of the second internal voltage generating circuit 32, and the first voltage control circuit 35 generates the first voltage control signals v_ctrl11 to v_ctrl1$n$ for varying a voltage level of the first internal voltage to have a voltage level of from the fourth voltage V4 to the second voltage V2. Here, the second voltage control circuit 36 is in a don't care state.

As a result, the first internal voltage generating circuit 31 is enabled in response to the first operation control signal op_ctrl1, and generates the first internal voltage Vin1 having a voltage level of from the fourth voltage V4 to the second voltage V2 according to the first voltage control signals v_ctrl11 to v_ctrl1$n$ and applies the first internal voltage Vin1 to the first bonding pad BP1. The second internal voltage generating circuit 32 is disabled in response to the second operation control signal op_ctrl2, so that the second internal voltage Vin2 is not output by the second internal voltage generating circuit 32.

The first internal voltage Vin1 applied to the first bonding pad BP1 is applied to the second bonding pad BP2 through the first substrate pad P1, the substrate wire line SL and the second substrate pad P2 of the packaging substrate 4. As a result, the semiconductor memory device supplies the semiconductor chip with the first internal voltage Vin1 having a voltage level of from the fourth voltage V4 to the second voltage V2 through the first internal voltage generating circuit 31.

When the semiconductor chip 3 requires an internal voltage having a voltage level that ranges from the third voltage V3 to the first voltage V1, the semiconductor memory device operates as follows.

The first operation control circuit 33 generates the first operation control signal op_ctrl1 for disabling operation of the first internal voltage generating circuit 31, the second operation control circuit 34 generates the second operation control signal op_ctrl2 for enabling operation of the second internal voltage generating circuit 32, and the second voltage control circuit 36 generates the second voltage control signals v_ctrl21 to v_ctrl2$n$ for varying a voltage level of the second internal voltage to have a voltage level of from the third voltage V3 to the first voltage V1. Here, the first voltage control circuit 35 is in a don't care state.

As a result, the second internal voltage generating circuit 32 is enabled in response to the second operation control signal op_ctrl2, and generates the second internal voltage Vin2 having a voltage level of from the third voltage V3 to the first voltage V1 according to the second voltage control signals v_ctrl21 to v_ctrl2$n$ and applies the second internal voltage Vin2 to the second bonding pad BP2. The first internal voltage generating circuit 31 is disabled in response to the first operation control signal op_ctrl1, so that the first internal voltage Vin1 is not output by the first internal voltage generating circuit 31.

The second internal voltage Vin2 applied to the second bonding pad BP2 is applied to the first bonding pad BP1 through the second substrate pad P2, the substrate wire line SL and the first substrate pad P1 of the packaging substrate 4. As a result, the semiconductor memory device supplies the semiconductor chip with the second internal voltage Vin2 having a voltage level of from the third voltage V3 to the first voltage V1 through the second internal voltage generating circuit 32.

When the semiconductor chip 3 requires an internal voltage having a voltage level ranging from the first voltage V1 to the fourth voltage V4, the semiconductor memory device operates as follows.

The first and second operation control circuits 33 and 34 respectively generate the first and second operation control signals op_ctrl1 and op_ctrl2 for enabling operation of both the first and second internal voltage generating circuits 31 and 32, and the first second voltage control circuits 35 and 36 respectively generate the first and second voltage control signals v_ctrl11 to v_ctrl1$n$ and v_ctrl21 to v_ctrl2$n$ for respectively varying voltage levels of the first and second internal voltages to have a voltage level of from the first voltage V1 to the fourth voltage V4.

As a result, the first internal voltage generating circuit 31 is enabled in response to the first operation control signal op_ctrl1, and generates the first internal voltage Vin1 having a voltage level of from the first voltage V1 to the fourth voltage V4 according to the first voltage control signals v_ctrl11 to v_ctrl1$n$ and applies the first internal voltage Vin1 to the first bonding pad BP1. The second internal voltage generating circuit 32 is enabled in response to the second operation control signal op_ctrl2, and generates the second internal voltage Vin2 having a voltage level of from the first voltage V1 to the fourth voltage V4 according to the second voltage control signals v_ctrl21 to v_ctrl2$n$ and applies the second internal voltage Vin2 to the second bonding pad BP2.

As a result, the semiconductor memory device simultaneously generate the first and second internal voltages Vin1 and Vin2 through the first and second internal voltage generating circuits 31 and 32 and so more stably supplies the semiconductor chip with the internal voltage having a voltage level of from the first voltage V1 to the fourth voltage V4.

Figure 4:
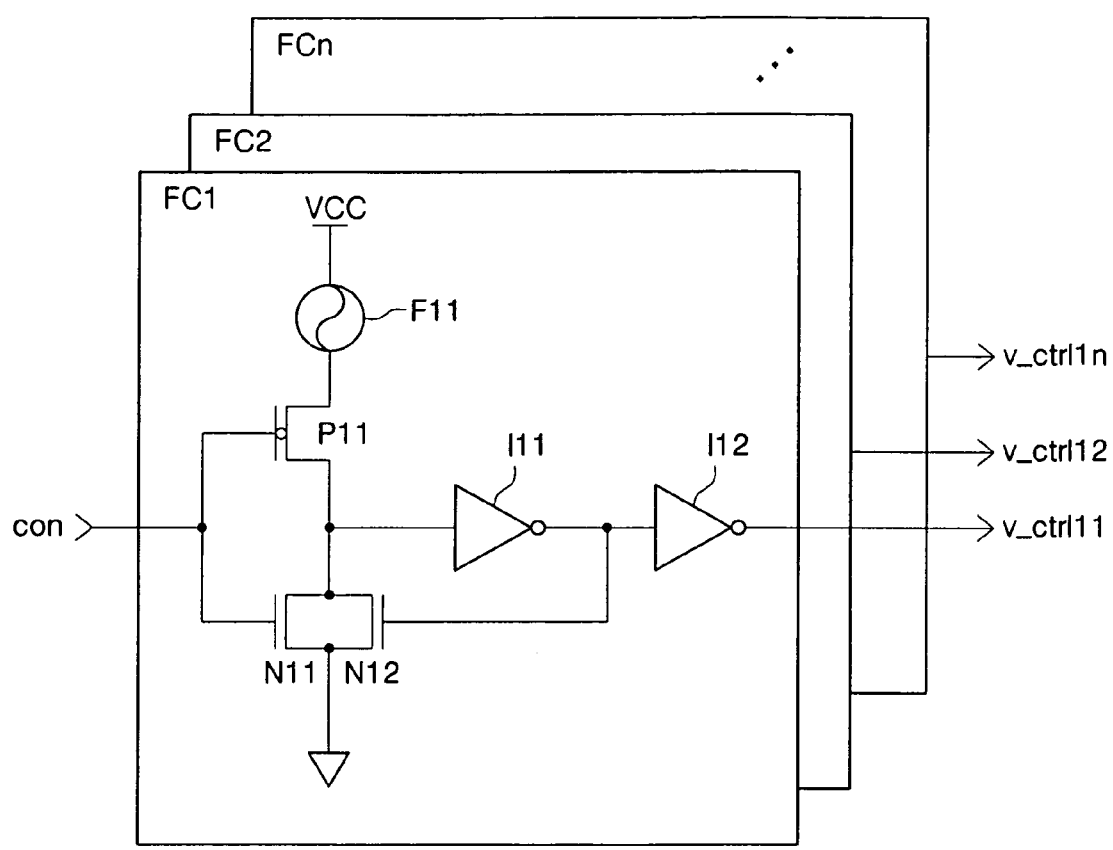
FIG. 4 is a circuit diagram illustrating a voltage control circuit according to another embodiment of the present invention.

FIG. 4 is a circuit diagram illustrating the voltage control circuit 35 or 36 according to another embodiment of the present invention.

Referring to FIG. 4, the voltage control circuit includes first to n-th fuse control circuits FC1 to FCn. Each of the fuse control circuits FC1 to FCn has a similar configuration to the operation control circuit of FIG. 2. Each of the fuse control circuits FC1 to FCn includes a fuse F11 connected to an external power voltage VCC, a PMOS transistor P11 having a source connected to the fuse F11, a drain connected to an NMOS transistor N11 and a gate receiving a control signal con, the NMOS transistor N11 having a drain connected to the PMOS transistor P11, a source connected to a ground voltage VSS and a gate receiving the control signal con, an NMOS transistor N12 having a drain connected to the PMOS transistor P11, a source connected to the ground voltage VSS and a gate receiving an output signal of an inverter I11, the inverter I11 connected to the drains of the NMOS transistors N11 and N12, and an inverter I12 connected to an output of the inverter I11.

Each of the fuse control circuits FC1 to FCn operates in the same way as the operation control circuit of FIG. 2. That is, each generates a signal having a low level when the fuse is cut and generates a signal having a high level when the fuse is connected.

The first voltage control circuit 35 outputs first voltage control signals v_ctrl11 to v_ctrl1n in response to whether the first to n-th fuse control circuits FC1 to FCn are cut or connected.

As described above, the semiconductor memory device according to another embodiment of the present invention not only determines whether to operate the first and second internal voltage generating circuits in response to the output signals of the first and second operation control circuits, but they also vary a voltage level of the internal voltage of the first and second voltage generating circuits by the first and second voltage control circuits.

Accordingly, the semiconductor memory device of the present invention not only selects one among a plurality of internal voltage generating circuits required for operation when packaging the semiconductor chip but also can further select for operation additional ones of the plurality of internal voltage generating circuits for generating the internal voltages having same voltage level, thereby increasing the capability of the semiconductor memory device to supply the internal voltage level.

In the embodiment shown in FIGS. 3 and 4, a voltage control circuit is provided for each of the first and second internal voltage generating; however, a voltage control circuit can optionally be applied to only one of the first and second internal voltage generating circuits if needed.

As described above, the semiconductor memory device of the present invention connects a plurality of internal voltage generating circuits through the bonding pads and the pads and substrate wire lines of the packaging substrate and programs the fuse of the operation control circuit to control operation of each of a plurality of internal voltage generating circuits. Thus, since it is possible to select one among a plurality of internal voltage generating circuits for operation when packaging the semiconductor chip, cost and time to manufacture the semiconductor memory device can be significantly reduced.

Further, the semiconductor memory device of the present invention varies a voltage level of the internal voltage of the internal voltage generating circuit through the voltage control circuit when packaging the semiconductor chip. Thus, since a plurality of internal voltage generating circuits can generate the internal voltages having same voltage level, the capability of the semiconductor memory device to supply the internal voltage can be improved.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor memory device, comprising:
   a semiconductor chip including a first voltage generating circuit that generates a first voltage in response to a first operation control signal, a second voltage generating circuit that generates a second voltage in response to a second operation control signal, a first operation control circuit that generates the first operation control signal, a second operation control circuit that generates the second operation control signal, a first bonding pad connected to an output of the first voltage generating circuit, and a second bonding pad connected to an output of the second voltage generating circuit; and
   a packaging substrate including a first substrate pad connected to the first bonding pad and a second substrate pad connected to the second bonding pad, wherein the first and second substrate pads are connected to each other through the packaging substrate such that at least one of the first voltage and the second voltage is applied to both the first and second bonding pads.

2. The device of claim 1, wherein each of the first and second operation control circuits is a fuse circuit which generates the first and second operation control signals in response to a programming status of a fuse.

3. The device of claim 2, wherein each of the first and second operation control circuits includes:
   a first fuse connected to a power voltage;
   a first PMOS transistor connected between the fuse and a node and being turned on and off in response to a control signal;
   a first NMOS transistor connected between the node and a ground voltage and being turned on and off in response to the control signal;
   a second NMOS transistor connected between the node and the ground voltage and being turned on and off in response to a feed back signal;
   a first inverter for inverting a signal applied to the node to generate the feed back signal; and
   a second inverter for inverting the feed back signal to generate an output signal.

4. The device of claim 2, wherein the control signal is generated when applied power is initiated.

5. The device of claim 1, wherein the packaging substrate connects the first and second substrate pads using at least one of a wire bonding and a beam lead.

6. A semiconductor memory device, comprising:
   a semiconductor chip including a first voltage generating circuit that selects whether to generate a first voltage in response to a first operation control signal and that varies a voltage level of the first voltage in response to a first voltage control signal, a second voltage generating circuit that selects whether to generate a second voltage in response to a second operation control signal, a first operation control circuit that generates the first operation control signal, a second operation control circuit that generates the second operation control signal, a first voltage control circuit that generates the first voltage control signal, a first bonding pad connected to the first voltage generating circuit, and a second bonding pad connected to the second voltage generating circuit; and
   a packaging substrate including a first substrate pad connected to the first bonding pad and a second substrate pad connected to the second bonding pad, wherein the first and second substrate pads are connected to each other through the packaging substrate such that at least one of the first voltage and the second voltage is applied to both the first and second bonding pads.

7. The device of claim 6, wherein the first voltage generating circuit generates the first voltage which has the same voltage level as the second voltage in response to the first voltage control signal.

8. The device of claim 6, further comprising, a second voltage control circuit that generates a second voltage control signal, wherein the second voltage generating circuit further varies a voltage level of the second voltage in response to the second voltage control signal.

9. The device of claim 8, wherein the second voltage generating circuit generates the second voltage which has the same voltage level as the first voltage in response to the second voltage control signal.

10. The device of claim 8, wherein the first and second voltage control circuits generate a third voltage in response to the first and second voltage control signals.

11. The device of claim 8, wherein each of the first and second voltage control circuits is a mode register set which generates a signal in response to externally applied coding signals.

12. The device of claim 8, wherein each of the first and second voltage control circuits includes a plurality of fuse circuits which generate first and second voltage control signals in response to programming statuses of fuses.

13. The device of claim 12, wherein each of the plurality of fuse circuits includes
a first fuse connected to a power voltage;
a first PMOS transistor connected between the fuse and a node and being turned on and off in response to a control signal;
a first NMOS transistor connected between the node and a ground voltage and being turned on and off in response to the control signal;
a second NMOS transistor connected between the node and the ground voltage and being turned on and off in response to a feed back signal;
a first inverter for inverting a signal applied to the node to generate the feed back signal; and
a second inverter for inverting the feed back signal to generate an output signal.

14. The device of claim 13, wherein the control signal is generated when a power up is detected.

15. The device of claim 6, wherein each of the first and second operation control circuits is a fuse circuit which generates the first and second operation control signals in response to a programming status of a fuse.

16. The device of claim 15, wherein each of the first and second operation control circuits includes
a second fuse connected to a power voltage;
a second PMOS transistor connected between the fuse and a node and being turned on and off in response to a control signal;
a third NMOS transistor connected between the node and a ground voltage and being turned on and off in response to the control signal;
a fourth NMOS transistor connected between the node and the ground voltage and being turned on and off in response to a feed back signal;
a third inverter for inverting a signal applied to the node to generate the, feed back signal; and
a fourth inverter for inverting the feed back signal to generate an output signal.

17. The device of claim 16, wherein the control signal is generated when applied power is initiated.

18. The device of claim 6, wherein the packaging substrate connects the first and second substrate pads using at least one of a wire bonding and a beam lead.

19. A semiconductor memory device, comprising:
a semiconductor chip including a first voltage generating circuit that generates a first voltage in response to a first operation control signal, a second voltage generating circuit that generates a second voltage in response to a second operation control signal, a first operation control circuit that generates the first operation control signal, a second operation control circuit that generates the second operation control signal, a first bonding pad connected to an output of the first voltage generating circuit, and a second bonding pad connected to an output of the second voltage generating circuit, wherein each of the first and second operation control circuits is a fuse circuit which generates the first and second operation control signals in response to a programming status of a fuse, wherein each of the first and second operation control circuits includes:
a first fuse connected to a power voltage;
a first PMOS transistor connected between the fuse and a node and being turned on and off in response to a control signal;
a first NMOS transistor connected between the node and a ground voltage and being turned on and off in response to the control signal;
a second NMOS transistor connected between the node and the ground voltage and being turned on and off in response to a feed back signal;
a first inverter for inverting a signal applied to the node to generate the feed back signal; and
a second inverter for inverting the feed back signal to generate an output signal; and
a packaging substrate including a first substrate pad connected to the first bonding pad and a second substrate pad connected to the second bonding pad, wherein the first and second substrate pads are connected to each other through the packaging substrate.

20. The device of claim 19, wherein the control signal is generated when applied power is initiated.

21. The device of claim 19, wherein the packaging substrate connects the first and second substrate pads using at least one of a wire bonding and a beam lead.

22. A semiconductor memory device, comprising:
a semiconductor chip including a first voltage generating circuit that selects whether to generate a first voltage in response to a first operation control signal and that varies a voltage level of the first voltage in response to a first voltage control signal, a second voltage generating circuit that selects whether to generate a second voltage in response to a second operation control signal, a first operation control circuit that generates the first operation control signal, a second operation control circuit that generates the second operation control signal, a first voltage control circuit that generates the first voltage control signal, a first bonding pad connected to the first voltage generating circuit, and a second bonding pad connected to the second voltage generating circuit, the device further comprising a second voltage control circuit that generates a second voltage control signal, wherein the second voltage generating circuit further varies a voltage level of the second voltage in response to the second voltage control signal, wherein each of the first and second voltage control circuits includes a plurality of fuse circuits which generate first and second voltage control signals in response to programming statuses of fuses, and wherein each of the plurality of fuse circuits includes:
a first fuse connected to a power voltage;
a first PMOS transistor connected between the fuse and a node and being turned on and off in response to a control signal;
a first NMOS transistor connected between the node and a ground voltage and being turned on and off in response to the control signal;
a second NMOS transistor connected between the node and the ground voltage and being turned on and off in response to a feed back signal;

a first inverter for inverting a signal applied to the node to generate the feed back signal; and a second inverter for inverting the feed back signal to generate an output signal; and a packaging substrate including a first substrate pad connected to the first bonding pad and a second substrate pad connected to the second bonding pad, wherein the first and second substrate pads are connected to each other through the packaging substrate.

23. A semiconductor memory device, comprising:

a semiconductor chip including a first voltage generating circuit that selects whether to generate a first voltage in response to a first operation control signal and that varies a voltage level of the first voltage in response to a first voltage control signal, a second voltage generating circuit that selects whether to generate a second voltage in response to a second operation control signal, a first operation control circuit that generates the first operation control signal, a second operation control circuit that generates the second operation control signal, a first voltage control circuit that generates the first voltage control signal, a first bonding pad connected to the first voltage generating circuit, and a second bonding pad connected to the second voltage generating circuit, wherein each of the first and second operation control circuits is a fuse circuit which generates the first and second operation control signals in response to a programming status of a fuse, wherein each of the first and second operation control circuits includes:

a second fuse connected to a power voltage;

a second PMOS transistor connected between the fuse and a node and being turned on and off in response to a control signal;

a third NMOS transistor connected between the node and a ground voltage and being turned on and off in response to the control signal;

a fourth NMOS transistor connected between the node and the ground voltage and being turned on and off in response to a feed back signal;

a third inverter for inverting a signal applied to the node to generate the feed back signal; and a fourth inverter for inverting the feed back signal to generate an output signal; and a packaging substrate including a first substrate pad connected to the first bonding pad and a second substrate pad connected to the second bonding pad, wherein the first and second substrate pads are connected to each other through the packaging substrate.

24. The device of claim 23, wherein the control signal is generated when applied power is initiated.

* * * * *